(12) United States Patent
Natsume

(10) Patent No.: US 6,207,539 B1
(45) Date of Patent: Mar. 27, 2001

(54) SEMICONDUCTOR DEVICE HAVING FIELD ISOLATING FILM OF WHICH UPPER SURFACE IS FLAT AND METHOD THEREOF

(75) Inventor: Hidetaka Natsume, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/093,313

(22) Filed: Jun. 9, 1998

Related U.S. Application Data (62) Division of application No. 08/998,836, filed on Dec. 29, 1997.

(30) Foreign Application Priority Data

Dec. 27, 1996 (JP) .................................... 8-350216

(51) Int. Cl.$^7$ .................................................. H01L 21/425
(52) U.S. Cl. ........................ 438/533; 438/564; 438/588; 438/596
(58) Field of Search .................................... 438/533, 588, 438/596, 564

(56) References Cited

U.S. PATENT DOCUMENTS

| 4,939,104 | 7/1990 | Pollack et al. ................... 437/162 |
| 5,204,279 | 4/1993 | Chan et al. . | |

FOREIGN PATENT DOCUMENTS

| 57-4137 | 1/1982 | (JP) . |
| 1-150338 | 6/1989 | (JP) . |
| 3-35526 | 2/1991 | (JP) . |
| 5-13564 | 1/1993 | (JP) . |

*Primary Examiner*—John F. Niebling
*Assistant Examiner*—David A. Zarneke
(74) *Attorney, Agent, or Firm*—Sughrue, Mion, Zinn, Macpeak & Seas, PLLC (57) ABSTRACT

The upper surface of a field oxide film 102 is made planar to eliminate a swell normally formed. More specifically, the field oxide film 102 is formed by recess LOCOS method so as to be convex formed in the direction toward the inside of a substrate 101 while having an upper surface that is substantially planar.

4 Claims, 7 Drawing Sheets

SEMICONDUCTOR DEVICE HAVING FIELD ISOLATING FILM OF WHICH UPPER SURFACE IS FLAT AND METHOD THEREOF

This is a divisional of application Ser. No. 08/998,836 filed Dec. 29, 1997.

BACKGROUND OF THE INVENTION

The present invention relates to a semiconductor device and the method thereof, and more particularly, to a semiconductor device provided with an SRAM memory cell and the method thereof. Conventionally, a static random access memory (SRAM) is utilized as a memory means in various kinds of semiconductor devices. The SRAM is made of a plurality of cells for storing data of "High" and "Low". As such cells, there is a high resistance load type.

Figure 3:
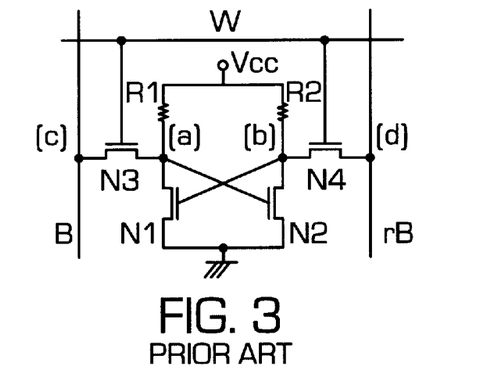
FIG. 3 is a circuit diagram showing the structure of an SRAM cell of a high resistance load type.

FIG. 3 shows the conventional circuit of the SRAM cell of the high resistance load type.

As shown in FIG. 3, in the memory cell, sources of a pair of n-channel field effect transistors (hereinafter referred to as an FETs) N1 and N2 are connected with the ground voltage line, and drains thereof are connected to one end of resistance elements R1 and R2, respectively. The other ends of the resistance elements R1 and R2 are connected with a source voltage line supplied with source voltage Vcc.

Here, a node (a) is connected with a gate of the FET N2 and a node (b) is connected with a gate of the FET N1.

The node (a) and a node (c) on a bit line B are connected with a source or a drain of an FET N3, respectively, and a node (d) on an inverting bit line rB and the node (b) are connected with a source or a drain of an FET N4, respectively.

Gates of the FETs N3 and N4 are connected with the same word line W.

Accordingly, when the word line W changes from Low level to High, the written levels stored at the nodes (a) and (b) are transferred to the bit lines B and rB, respectively.

FIGS. 4A–E show the conventional manufacturing process of such an SRAM cell with the node (a) in FIG. 3 as a center.

Figure 4A:
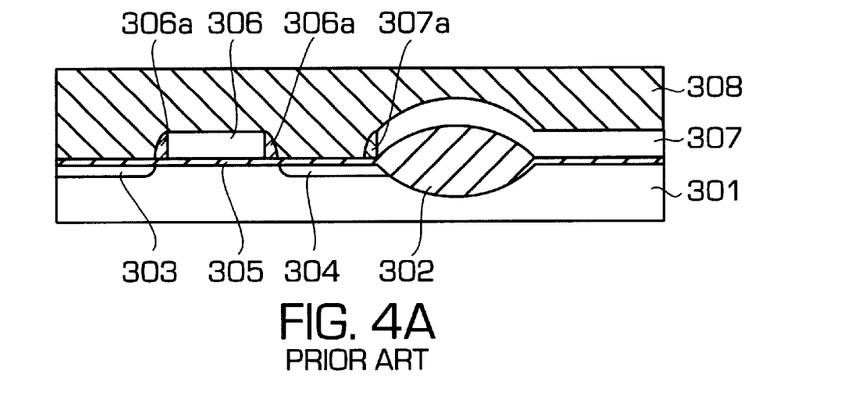
FIGS. 4A–4E are cross-sectional views showing steps of a conventional method of manufacturing the SRAM cell with a node (a) as a center point in FIG. 2.

As shown in FIG. 4A, at first, a source 303, a drain 304, a gate insulating film 305, and a gate electrode 306 formed on the gate insulating film 305 are formed at a predetermined active area defined by a field oxide film 302 on a substrate 301. The source 303, the drain 304, the gate insulating film 305, and the gate electrode 306 constructs the FET N3. Gate electrode film 307 is formed up to an end of the field oxide film 302, and an interlayer insulating film 308 is formed thereon. Side walls 306a are formed on side surfaces of the gate electrode 306. The gate electrode film 307 is connected with the gate electrode of the fet N2, although not shown in FIG. 3.

Figure 4B:
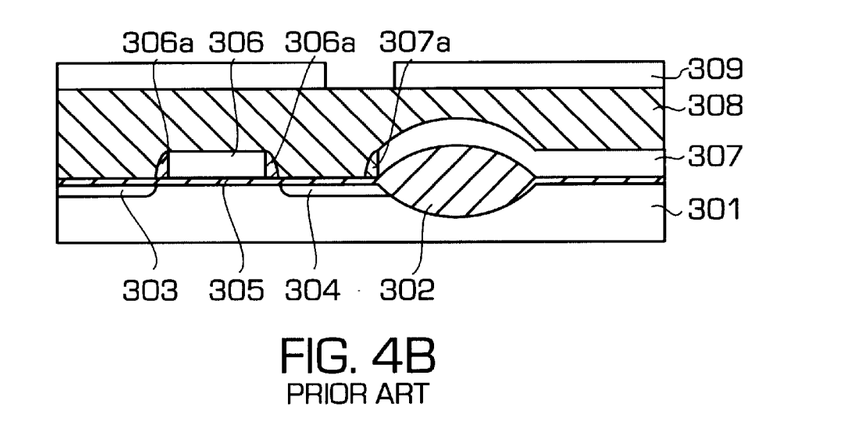

As shown in FIG. 4B, a resist pattern 309 with an opening formed by photolithography is formed on the interlayer insulating film 308.

Figure 4C:
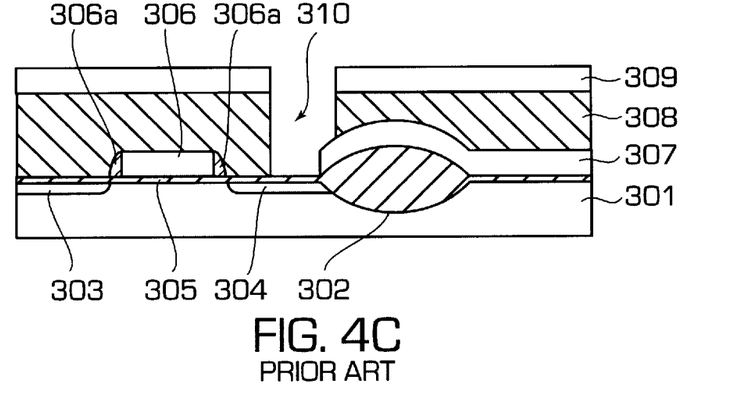

As shown in FIG. 4C, the interlayer insulating film 308 is selectively removed with the resist pattern 309 as a mask to form a shared contact region 310.

Figure 4D:
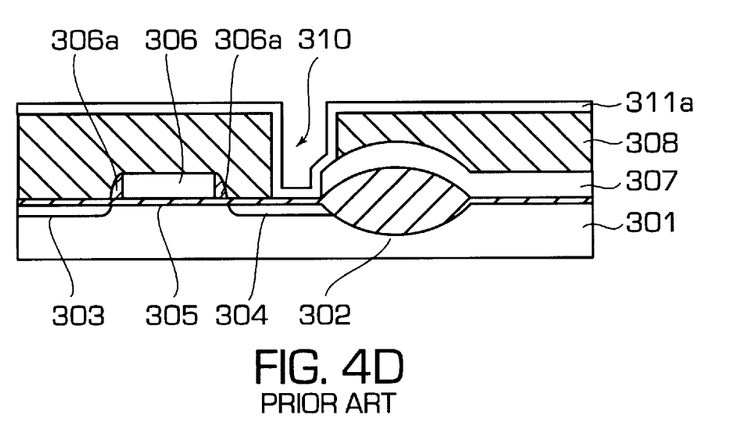
Figure 4E:
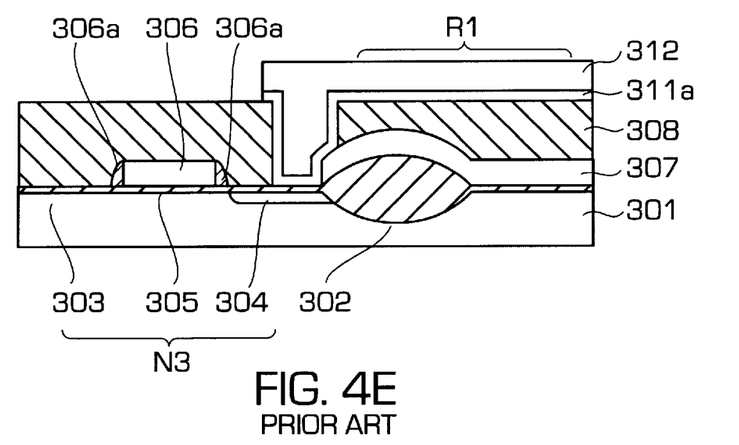

Next, after the resist pattern 309 is removed, as shown in FIG. 4D, a polysilicon film 311a is deposited over the entire surface, and, as shown in FIG. 4E, by selectively etching the polysilicon film 311a with a resist pattern 312 as a mask, film is formed into a desired shape. Then, impurities is introduced, for example, ion implantation with a predetermined part of the region of the film shape being masked to form a conductive film 311b. It is to be noted that the impurities are not introduced into the masked region and the masked region remains highly resistant to become the resistance element R1. In fact, the resistance element R1 is introduced impurities less than the impurities implanted by the process to control resistance value thereof. In other words, a part of the conductive film 311b is highly resistant to form the resistance element R1 shown in FIG. 3. Although not shown in FIG. 4E, the conductive film 311b is connected with power source line. The drain 304 and the gate electrode film 307 are connected by the conductive film 311b in the above shared contact region 310 to form the above node (a). Such a semiconductor device is described by U.S. Pat. No. 5,204,279.

However, the conventional structure mentioned in U.S. Pat. No. 5,204,279 has a problem that the shared contact region actually formed is larger than the designed value.

Figure 5A:
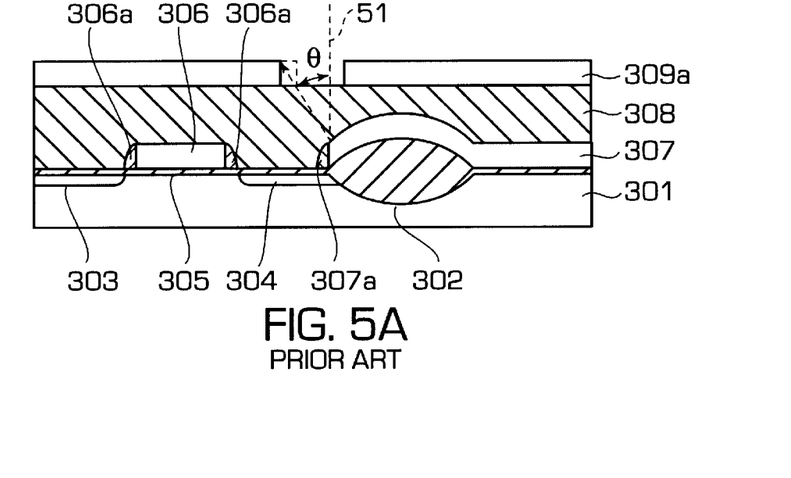
FIGS. 5A–C are cross-sectional views showing steps for explaining the problem of the conventional method according to FIGS. 4A–4E.
Figure 5B:
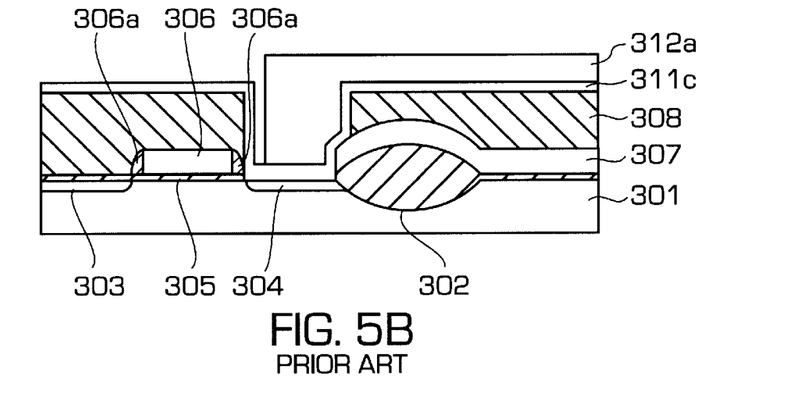

In the conventional structure, the resist pattern 309 for forming the shared contact region 310 is actually formed as a resist pattern 309a having a larger opening, as shown in FIGS. 5A–5B. More specifically, the resist pattern 309a is obtained as a result of partially illuminating a desired region of an applied photoresist by a photolithographic technique to develop the photoresist, and removing the region irradiated by light. In this partial light irradiation, since the end of the gate electrode film 307 is underlying the opening, reflected light 51 from the end of the gate irradiates the back surface of the applied photoresist film. As a result, as shown in FIG. 5A, the resist pattern 309a has an opening larger than the designed value is formed. This phenomenon is more remarkable in the case where a refractory metal silicide is used as a material of the gate electrode line 307.

Figure 5C:
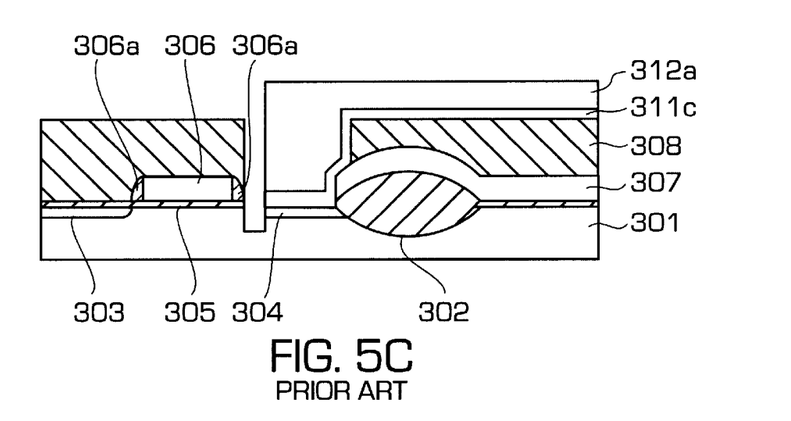

Next, as described with FIG. 5B, the polysilicon film is deposited over the entire surface, selective etching is performed with a resist pattern 312a as a mask, and impurities are introduced ion implantation into the region other than the region where the resistance is to be formed, to form electrode film 311c. However, since the shared contact region formed is larger than the designed value, the resist pattern 312a formed does not cover the entire shared contact region. As a result, as shown in FIGS. 5C, during the etching for forming the electrode film 311c, a hole is formed even in the substrate 301.

Figure 6A:
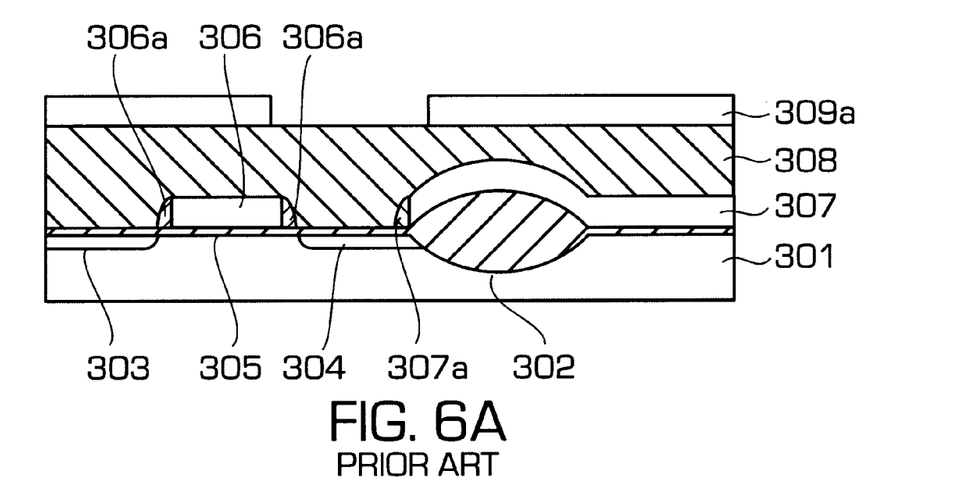
FIGS. 6A–B are cross-sectional views showing steps for explaining the other problem of the conventional method according to FIGS. 4A–E.
Figure 6B:
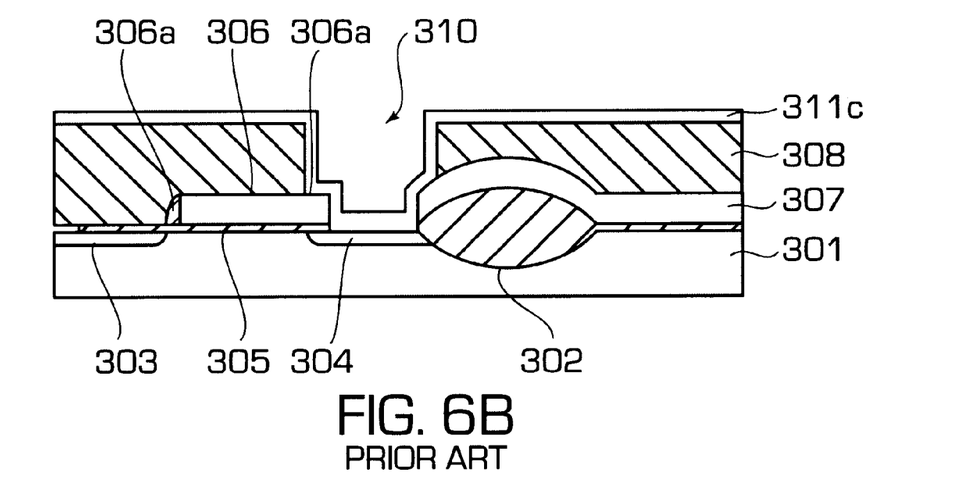

Moroever, when the distance between the gate electrode 306 and the field oxide film 302 is narrower, the opening of the resist 309a is over the gate electrode 306 as shown in FIG. 6A. Thus, in this worst case, a short circuit is caused, as shown in FIG. 6B. Therefore, it is difficult to improve the extent of integration.

SUMMARY OF THE INVENTION

It is therefore an object of the present invention to provide an improved semiconductor device including a shared contact hole having an opening with the actual designed size.

It is another object of the present invention to provide an improved semiconductor device with reduced call size.

A semiconductor device of the present invention comprises: a semiconductor substrate; an element isolation region formed on the semiconductor substrate; a diffusion region formed adjacent to the element isolation region on the semiconductor substrate; a first conductive film formed on the element isolating region, the first conductive film having an upper surface over the element isolation region being substantially flat; an interlayer insulating film covering the diffusion region and the first conductive film, the interlayer insulating film having an opening formed therein to expose the diffusion region and an end of the first conductive film; and a second conductive film formed on the interlayer insulating film and buried in the opening to connect to the end of the first conductive film and the diffusion layer.

A method of manufacturing a semiconductor device of the present invention comprises the steps of:

forming an element isolation region on the semiconductor substrate, the element isolation region has an upper portion which is substantially flat and an under portion;

selectively forming a first conductive film and second conductive film, the first conductive film on the element isolation region and having an end arranged at an end of the element isolation region, the second conductive film over the semiconductor substrate apart from the first conductive film and the element isolation region;

forming a diffusion region between the first and second conductive films on the semiconductor substrate;

forming an interlayer insulating film on the entire surface of the semiconductor substrate;

forming a resist film on the interlayer insulating film, the resist film having a opening arranged over the end of the first conductive film and a part of the diffusion region apart from the first conductive film;

removing the interlayer insulating film with the resist film as a mask to form a contact hole exposing the end of the first conductive film and the part of the diffusion region; and forming a third conductive film in the contact hole and on the interlayer insulating film to connect to the end of the first conductive film and the part of the diffusion region;

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1A:
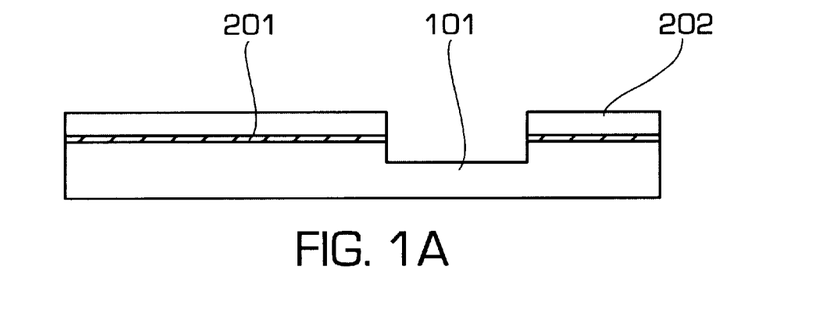
FIGS. 1A–1H are cross sectional views showing respective steps of a method of manufacturing a semiconductor device including an SRAM memory cell according to a first embodiment of the present invention.
Figure 1B:
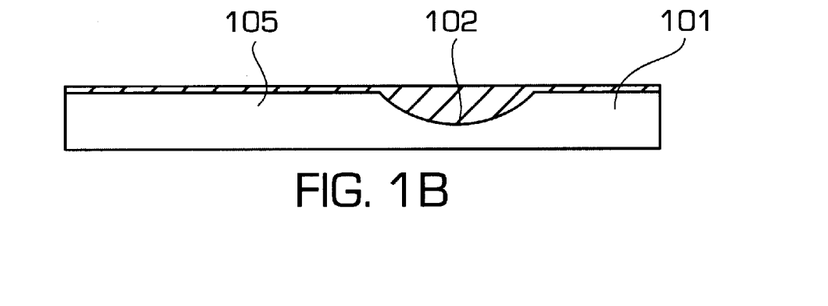

Referring to FIG. 1A, an oxide film 201 is formed on a semiconductor substrate 101 of a P-type. The thickness of the oxide film 201 is 5–20 nm. A nitride film 202 is formed on the oxide film 201 by the chemical vapor deposition (CVD) method. The thickness of the nitride film 202 is 80–200 nm. The nitride film 202, the oxide film 201, and the semiconductor substrate 101 is selectively etched at the depth of 40–150 nm to produce a recess in the semiconductor substrate 101. The semiconductor substrate 101 is oxidized with the nitride film 202 as a mask at atmosphere including water (that is, wet-oxidized) at the temperature 1000° or higher to produce the field oxide film 102 of which the thickness is 200–500 nm as shown in FIG. 1B. That is, the field oxide film 102 is formed by the recessed local oxidation of silicon (recessed LOCOS) method. The upper surface of the field oxide film 102 is made planar with a swell thereon eliminated. In other words, the field oxide film 102 is formed by recessed LOCOS method so as to be convex in the direction toward the inside of the substrate 101 but such that the upper surface is formed to be substantially planar. As a result, the upper surface of the electrode film 107 to be formed thereon is made also substantially planar or flat with a swell toward the above being eliminated. After the nitride film 202 an the oxide film 201 is removed, a gate insulating film 105 is formed on the semiconductor substrate 101 by for example, thermal oxide method. The gate insulating film 105 has a thickness of 5–20 nm.

Figure 1C:
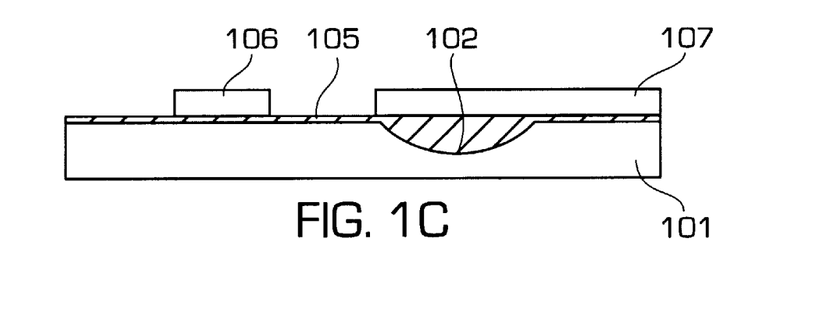

Referring to FIG. 1C, a conductive film is formed on the entire surface of the semiconductor substrate 101. The conductive film 16 made from polysilicon having the thickness of 50–150 nm or polysilicide film including a silicide on the polysilicon. The conductive film is selectively etched to form a gate electrode 106 and a gate electrode film 107. The gate electrode film 107 is formed to be approximately coincident with one end of the field oxide film 102. Thereafter, impurities, for example, phosphorus or arsenic may be implanted in an amount of $0.1-3\times10^{13}$ atoms/cm$^2$ into the semiconductor substrate 101 using the gate electrodes 106 and 107 as a mask.

Figure 1D:
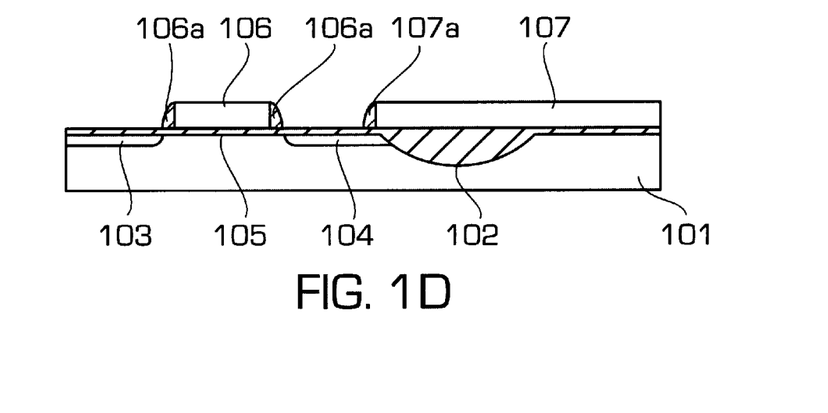

Referring to FIG. 1D, an oxide film is grown on the entire surface of the semiconductor substrate 101 by the CVD method, having thickness of 50–200 nm, and is etched to form side walls 106a and 107a. Impurities are implanted into the semiconductor substrate 101 at an amount of $1-5\times10^{15}$ atoms/cm$^2$ to form a first diffusion region 103 as one of a source or a drain and a second diffusion region 104 as the another of a source or a drain, using the gate electrode 106 and 107 and side walls 106a and 107a as a mask. The first and second diffusion regions 103 and 104, the gate insulating film 105, and a gate electrode 106 constitutes the FET N3.

Figure 1E:
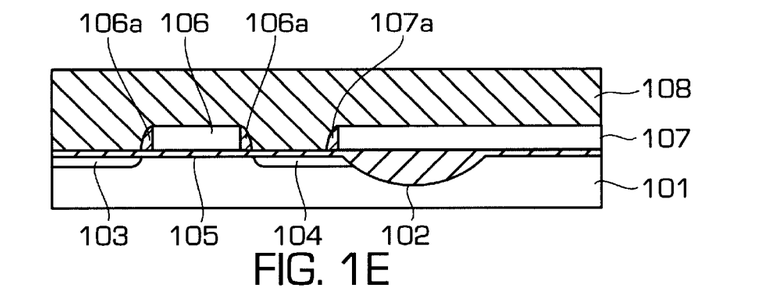

Referring to 1E, an interlayer insulating film 108 is formed on the entire surface of the semiconductor substrate 101. For example, the interlayer insulting film 108 is silicon oxide film grown by the CVD method and the surface thereof is planed. The interlayer insulating film 108 has a thickness of 100–1000 nm.

Figure 1F:
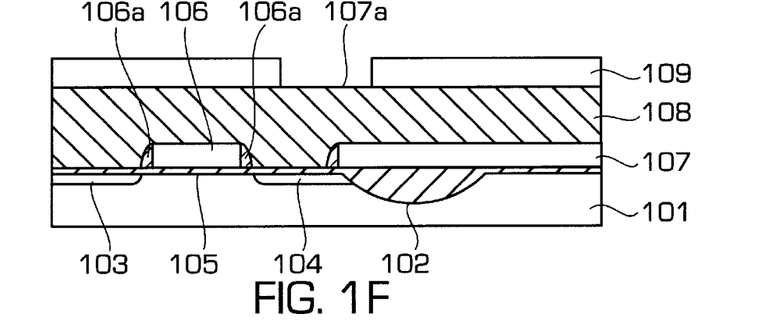

Referring to FIG. 1F, a resist pattern 109 with an opening formed by photolithography is formed on the interlayer insulating film 108. Reflected light from the end of the electrode film 107 is reflected directly above with little angular dispersion. Therefore, the opening is formed at substantially the same size as designed.

Figure 1G:
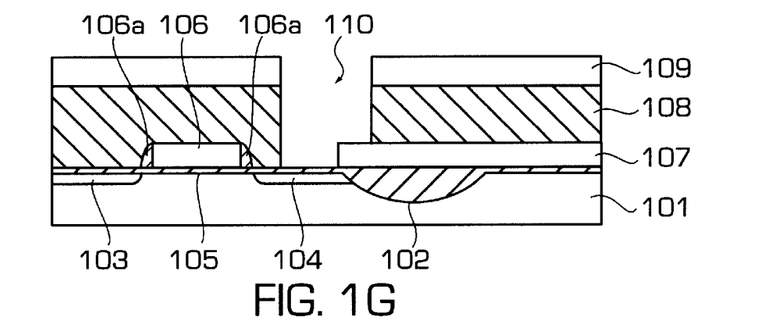

Referring to FIG. 1G, the interlayer insulating film 108 and the side wall 107a are selectively removed by dry etching using the resist pattern 109 as a mask, and thereby to form a shared contact region 11 with a desired designed width.

Figure 1H:
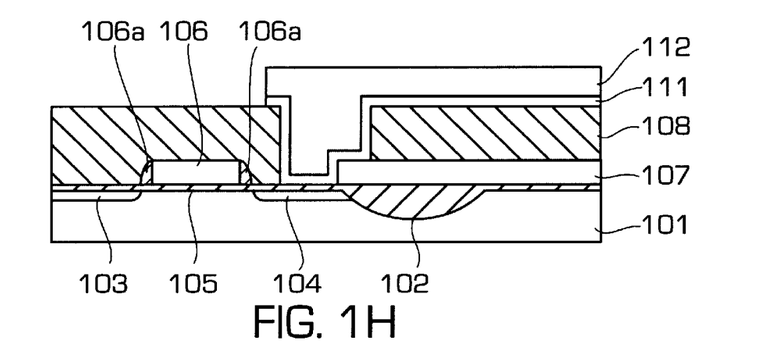

After the resist pattern 109 is removed, a polysilicon film is deposited over the entire surface. Referring to FIG. 1H, by selectively dry etching the polysilicon film with a resist pattern 112 as a mask, the polysilicon film is formed into a desired shape. Then, by selectively introducing impurities by ion implantation into the polysilicon film at regions other than the region where a resistor is to be formed, conductive film 111 is formed. The conductive film 111 is a polysilicon film or a semi-insulated polysilicon film (SIPOS) grown by the CVD method and has a thickness of 30–150 nm.

Here, since the shared contact region is formed so as to achieve the predetermined size coincident with the pattern formation size for the conductive film 111, a hole is not formed in the substrate 101 and there is no concern of a short circuit between the conductive film 111 and the gate electrode 106.

Figure 2:
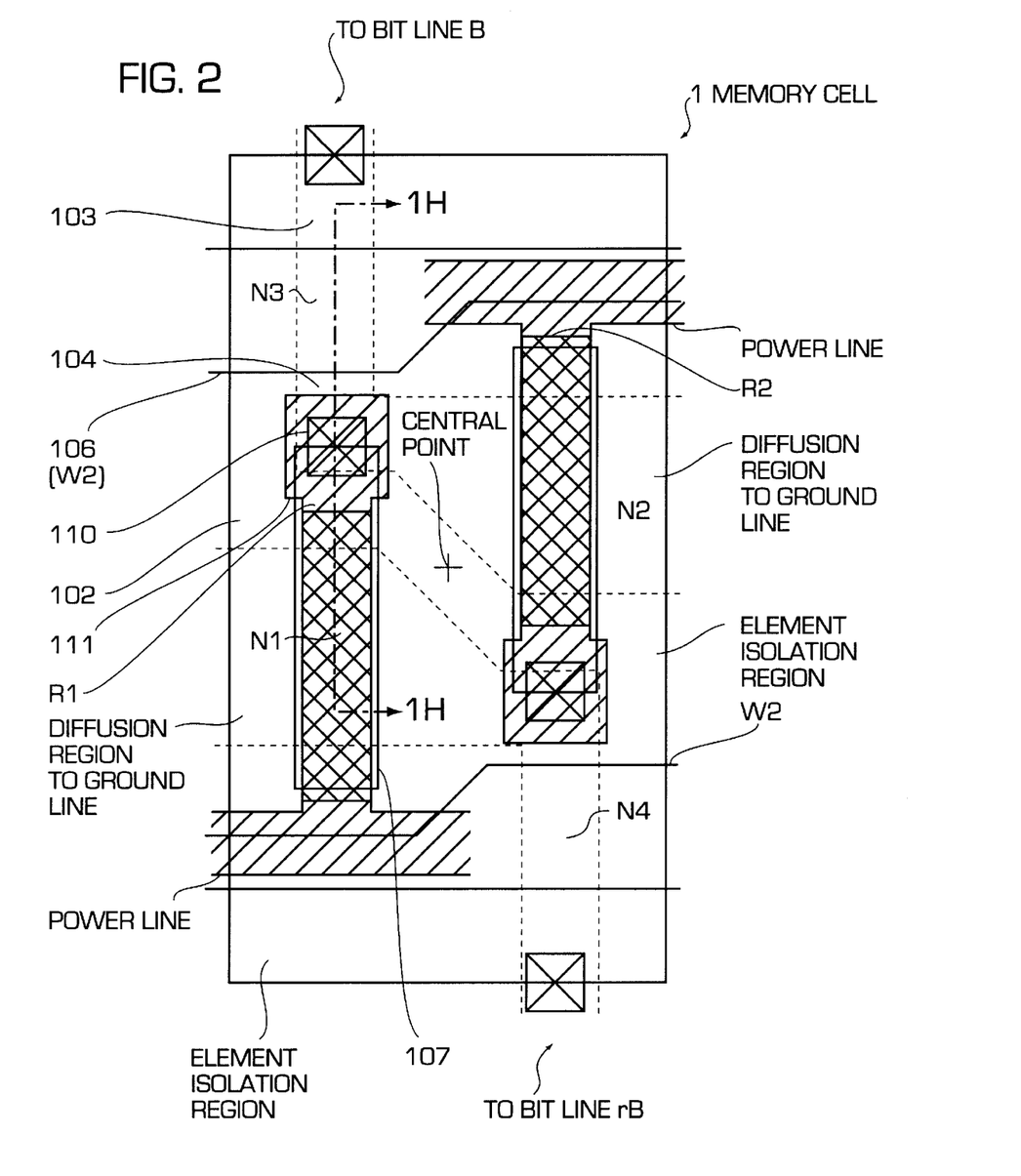
FIG. 2 is a plan view illustrative of one memory cell according to a first embodiment of the present invention.

FIG. 2 shows a plan view illustrative of one memory call of SRAM having a high resistance type of the present invention. The area shown in FIG. 2 includes the circuit structure shown in FIG. 3. FIG. 1H is a cross-sectional view taken along a line A—A' shown in FIG. 2. Dotted lines illustrate the separation between active regions and element isolation regions. Two word lines are arranged in a horizontal direction to each other. One word line W1 is gate electrode 106 of FET N3. The first and second diffusion regions 103 and 104 are arranged on either side or word line W1. The shared contact hole 110, the gate electrode film 107, and the conductive film 111 are stacked upon the second diffusion region 104. The conductive film 111 has a low resistance portion as the power line and a high resistance portion as the resistance R1 or R2. The gate electrode film 107 is extended in the vertical direction from the shared contact hole 110 under the conductive film 111. The gate electrode film 107 constitutes the gate electrode of the FET N2. The source and drain of the FET N2 are arranged at both sides of the gate electrode film 107. The high resistance portion of the conductive film 111 is extended along the gate electrode film 107 and the low resistance portion of the conductive film 111 is extended in horizontal direction from the end of the high resistance portion and is a power source line. The second diffusion region of the FET N3 is extended from the shared contact hole 110 toward the horizontal direction so that the extended portion constitutes source or drain of the FET N1. The explanation according to the FET N4 is omitted since the layout of the memory cell is symmetrical at the central point and the structure of the FET N4 is omitted since the layout of the memory cell is symmetrical at the central point and the structure of the FET N4 is the same as that of the FET N3.

It is to be noted that, in the above embodiment, the conductive film 111 is formed right above the interlayer insulating film 108. In other words, in the above embodiment, the conductive film 111 is formed as a second conductive layer. However, the invention is not limited to this, and the conductive film 111 may be formed as a third or later film layer. For example, after ground potential layer is formed as a second conductive layer, the conductive film 111 may be formed on an interlayer insulating film covering the ground potential layer. In this case, the interlayer insulating film 108 is formed as two layers, and, although not shown in FIG. 1, another film layer (such as ground potential film) exists between the multiple interlayer insulating film 108.

Although it may be, the upper surface of the field oxide film 102 does not have to be completely planar. That is, it is enough if the plurality of the field oxide film 102 is sufficiently planar so that only an area no larger than needed or with acceptable tolerances, is exposed to light by reflection from the end of the gate electrode film 107 below the resist pattern 109 during photolithography.

For example, the shared contact region 110 formed in the interlayer insulating film 108 is normally on the order of 0.4 to 0.7 $\mu$m wide and 0.4 to 1 $\mu$m deep. The electrode film 107 is on the order of 0.1 to 0.3 $\mu$m thick, and the length thereof which goes into the shared contact region 110 is on the order of 0.2 $\mu$m. Within the range described in the above, it is sufficient that the swell on the upper surface of the field oxide film 101 is 0.1 $\mu$m or less in height. Also, it is sufficient that an angle θ of reflection of exposing light which is vertically incident to and is reflected by the end of the electrode film 107 (FIG. 4) is less than 30°.

As described in the above, a semiconductor device according to the present invention has the element isolating region of which surface is formed to be substantially planar.

By the above, the surface of the electrode film 107 formed so as to pass over the element isolating region is also formed to be planar. Therefore, when the resist pattern used for forming the opening in the interlayer insulating film is formed by photolithography, the influence of exposing light diagonally reflected by the end of the electrode film 107 below is decreased. As a result, according to the present invention, there is an effect that the opening to be shared contact region can be formed having it designed dimensions.

It is apparent from the above discussion and figures that the present invention is not limited to the above embodiments but may be modified and changed without departing from the scope and spirit of the invention.

What is claimed is:

1. A method of manufacturing a semiconductor device for an SRAM memory cell comprising:
    forming a mask layer covering a semiconductor substrate;
    selectively removing said mask layer and said semiconductor substrate to form a recess in said semiconductor substrate;
    performing an oxidation with said mask layer as a mask to form an element isolation film having a substantially planar upper surface in the recess;
    selectively forming a first conductive film and a second conductive film, said first conductive film being formed on said element isolation film and having an end coincident with an end of said element isolation film and having a substantially flat upper surface, said second conductive film being formed over said semiconductor substrate apart from said first conductive film and said element isolation film;
    forming a diffusion region on said semiconductor substrate between said first and second conductive films;
    forming an interlayer insulating film over the entire surface of said semiconductor substrate;
    forming a resist film on said interlayer insulating film, said resist film having an opening arranged over said end of said first conductive film and a part of said diffusion region;
    removing a portion of said interlayer insulating film using said resist film as a mask to form a contact hole exposing said end of said first conductive film and said part of said diffusion region.

2. The method as claimed in claim 1, wherein said recess LOCOS is performed at atmosphere including water at a temperature of 1000° C. or higher.

3. The method as claimed in claim 1, wherein an angle between input light and reflected light from said first conductive film has an angle of reflection of 30° or less, when said opening of said resist film is formed using an irradiation of said input light.

4. The method as claimed in claim 1, wherein said element isolation film has a thickness of 0.1 $\mu$m or less.

* * * * *

UNITED STATES PATENT AND TRADEMARK OFFICE
CERTIFICATE OF CORRECTION

PATENT NO. : 6,207,539 B1
DATED : March 27, 2001
INVENTOR(S) : Hidetaka Natsume

It is certified that error appears in the above-identified patent and that said Letters Patent is hereby corrected as shown below:

<u>Column 4,</u>
Line 60, delete "11" insert -- 110 --

Signed and Sealed this

Twenty-second Day of January, 2002

Attest:

JAMES E. ROGAN
*Director of the United States Patent and Trademark Office*

*Attesting Officer*